(12) United States Patent
Johnston et al.

(10) Patent No.: US 7,279,423 B2
(45) Date of Patent: Oct. 9, 2007

(54) FORMING A COPPER DIFFUSION BARRIER

(75) Inventors: Steven W. Johnston, Portland, OR (US); Valery M. Dubin, Portland, OR (US); Michael L. McSwiney, Hillsboro, OR (US); Peter Moon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/284,576

(22) Filed: Oct. 31, 2002

(65) Prior Publication Data

US 2004/0084773 A1    May 6, 2004

(51) Int. Cl.
*H01L 21/00*    (2006.01)
(52) U.S. Cl. .................. 438/687; 438/678; 438/627
(58) Field of Classification Search ............ 438/687, 438/674, 396, 399, 677, 253, 256, 678, 638, 438/586, 626, 643, 225, 675, 688, 397, 650, 438/739, 597, 629, 648, 240, 241, 627
See application file for complete search history.

(56) References Cited

U.S. PATENT DOCUMENTS

| | | | | |
|---|---|---|---|---|
| RE28,820 E | * | 5/1976 | Beer | 148/242 |
| 6,117,782 A | * | 9/2000 | Lukanc et al. | 438/692 |
| 6,294,425 B1 | * | 9/2001 | Hideki | 438/253 |
| 6,346,741 B1 | * | 2/2002 | Van Buskirk et al. | 257/664 |
| 6,361,823 B1 | * | 3/2002 | Bokisa et al. | 427/98 |
| 6,441,492 B1 | | 8/2002 | Cunningham | |
| 6,461,675 B2 | * | 10/2002 | Paranjpe et al. | 427/250 |
| 6,461,914 B1 | * | 10/2002 | Roberts et al. | 438/253 |
| 6,503,343 B1 | * | 1/2003 | Tench et al. | 148/272 |
| 6,551,872 B1 | * | 4/2003 | Cunningham | 438/225 |
| 6,579,785 B2 | * | 6/2003 | Toyoda et al. | 438/597 |
| 6,630,387 B2 | * | 10/2003 | Horii | 438/396 |
| 6,649,513 B1 | * | 11/2003 | Tsai et al. | 438/626 |
| 6,936,535 B2 | * | 8/2005 | Kim et al. | 438/656 |
| 6,958,547 B2 | * | 10/2005 | Dubin et al. | 257/774 |
| 6,977,224 B2 | * | 12/2005 | Dubin et al. | 438/678 |

(Continued)

FOREIGN PATENT DOCUMENTS

| | | |
|---|---|---|
| WO | WO 01/29893 | 4/2001 |
| WO | WO 03/056612 | 7/2003 |

OTHER PUBLICATIONS

Patent Abstracts of Japan, vol. 008, No. 187 (C-240), Aug. 28, 1984 & JP 59 080766 A, May 10, 1984, abstract.
Saito et al., "A Thick-Cu Process for Add-On Interconnections Using Photosensitive Varnish for Thick Interlayer Dielectric", IEEE, 2000, pp. 123-125.

*Primary Examiner*—Laura M. Schillinger
(74) *Attorney, Agent, or Firm*—Trop, Pruner & Hu, P.C.

(57) ABSTRACT

Noble metal may be used as a non-oxidizing diffusion barrier to prevent diffusion from copper lines. A diffusion barrier may be formed of a noble metal formed over an adhesion promoting layer or by a noble metal cap over an oxidizable diffusion barrier. The copper lines may also be covered with a noble metal.

10 Claims, 4 Drawing Sheets

U.S. PATENT DOCUMENTS

| | | |
|---|---|---|
| 7,001,782 B1 * | 2/2006 | Diana et al. .................... 438/3 |
| 7,008,872 B2 * | 3/2006 | Dubin et al. ................ 438/678 |
| 7,049,234 B2 * | 5/2006 | Cheng et al. ............... 438/687 |
| 7,087,517 B2 * | 8/2006 | Andreyushchenko et al. ......................... 438/627 |
| 7,229,922 B2 * | 6/2007 | Dubin et al. ................ 438/687 |
| 2001/0033020 A1 | 10/2001 | Stierman et al. |
| 2002/0123220 A1 | 9/2002 | Sambucetti et al. |
| 2005/0147762 A1 * | 7/2005 | Dubin et al. ................ 427/437 |

* cited by examiner

FORMING A COPPER DIFFUSION BARRIER

BACKGROUND

This invention relates generally to processes for making semiconductor integrated circuits.

In the so called damascene approach, copper layers may be formed in trenches within inter-level dielectric material. In some cases, the copper material ultimately forms metal lines for signal conduction. However, copper material may tend to diffuse causing adverse effects on nearby components.

Thus, it is desirable to provide a diffusion barrier to prevent the diffusion of copper atoms. Currently, tantalum or titanium based diffusion barriers are used. However, tantalum and titanium form native oxides which hinder direct electroplating of the copper onto the tantalum or titanium surface with acceptable adhesion and within-wafer uniformity.

Thus, it may be necessary to form a copper seed deposition in situ (in the same chamber used to deposit the tantalum or titanium based diffusion barrier). However, the need to provide a physical vapor deposition copper seed layer is cumbersome. Moreover, the adhesion between the overlying barrier material and the underlying dielectric may be unacceptable in some cases.

Thus, there is a need for better ways to provide diffusion barriers under copper layers.

DETAILED DESCRIPTION

Figure 1:
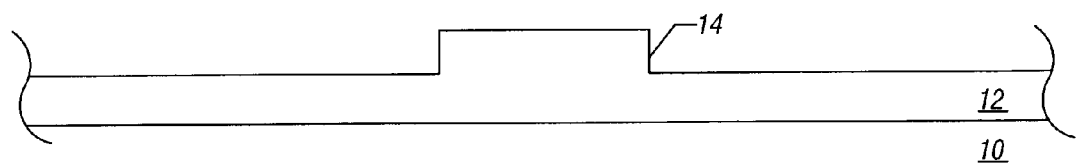
FIG. 1 is an enlarged cross-sectional view of a portion of a wafer in accordance with one embodiment of the present invention.

Referring to FIG. 1, a semiconductor substrate 10 may be covered with dielectric material 12, such as silicon dioxide, nitride, or other dielectric materials. A dielectric separator 14 may be formed to form opposed regions for defining copper lines.

Figure 2:
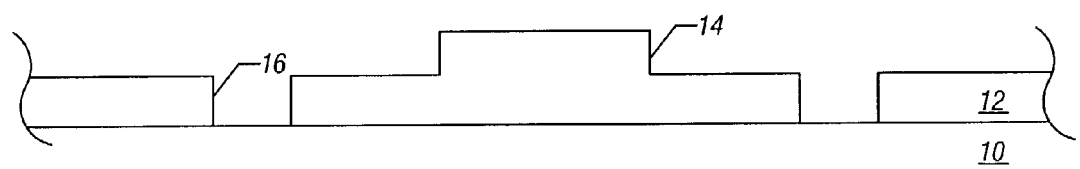
FIG. 2 is an enlarged cross-sectional view of the wafer after further processing in accordance with one embodiment of the present invention.

Conventional lithography and etching may be used to form trenches or vias 16 in the dielectric layer 12 as shown in FIG. 2. These features may be defined according to the damascene approach in one embodiment. While embodiments are illustrated that use the trench first process, other processes may involve a via first process or other techniques.

Figure 3:
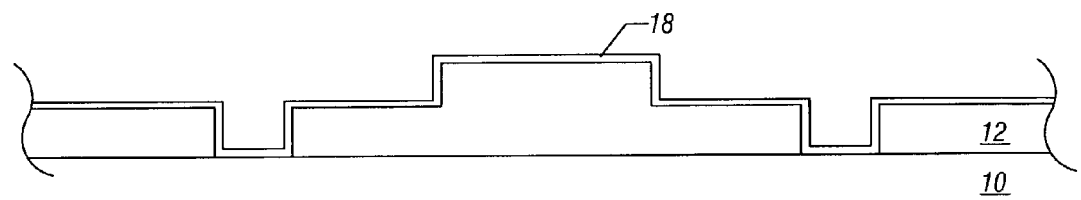
FIG. 3 is an enlarged cross-sectional view of the wafer after further processing in accordance with one embodiment of the present invention.

Thereafter, an adhesion promoting layer 18, such as titanium, titanium nitride, ruthenium oxide, tantalum, or tantalum nitride, to mention a few examples, may be deposited, as shown in FIG. 3, in one embodiment. The layer 18 provides adhesion between the dielectric material 12 and the overlying layers. In another embodiment, the adhesion promoting layer 18 may be absent from the bottom of the via 16.

Figure 4:
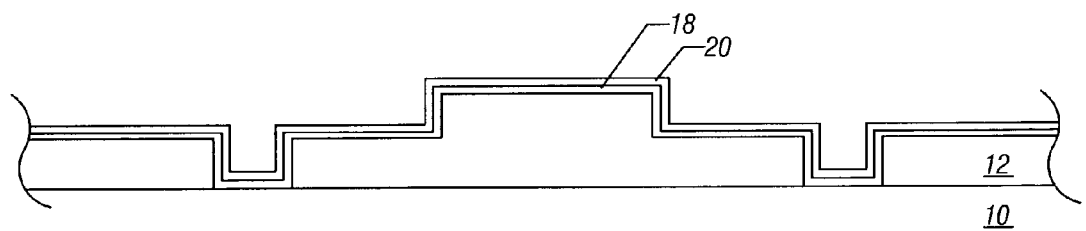
FIG. 4 is an enlarged cross-sectional view of the wafer after further processing in accordance with one embodiment of the present invention.

Following an in situ degas and/or preclean, an underlying non-oxidizing noble metal diffusion barrier 20 may be deposited as shown in FIG. 4. The noble metal diffusion barrier 20 blocks the diffusion of copper atoms. Suitable noble metals for this purpose include platinum, gold, palladium, osmium, ruthenium, rhodium, molybdenum, iridium, RuN, RuO, and MoN, to mention several examples.

The noble metal may be deposited using physical vapor deposition, chemical vapor deposition, atomic layer deposition, hybrids of any of the above or any other available technique. When using a chemical vapor deposition or atomic layer deposition, a thin nitride or oxide barrier layer can be grown, in some embodiments, to promote adhesion to the surround dielectric material by varying the input reactant gases. The pure bulk barrier material may then be grown to a precise thickness to promote a chemical mechanical planarization (CMP) compatible barrier. Chemical vapor deposition and/or atomic layer deposition methods may also lead to greater step coverage, symmetry, and within-wafer uniformity compared to physical vapor deposition.

Figure 5:
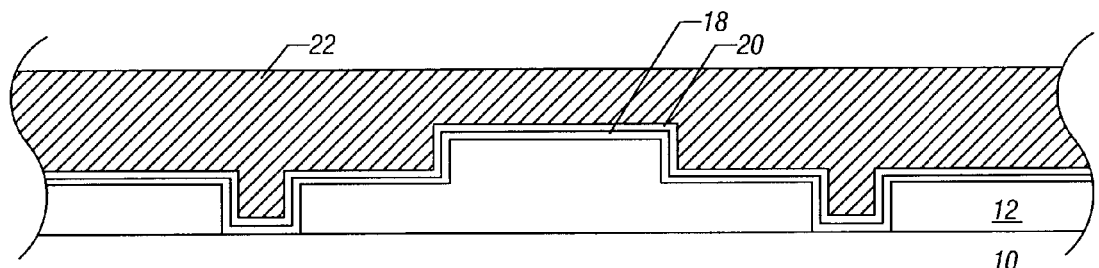
FIG. 5 is an enlarged cross-sectional view of the wafer after further processing in accordance with one embodiment of the present invention.

As shown in FIG. 5, a trench plus via fill may be accomplished, filling the entire structure with copper 22. In some embodiments a dual damascene plating process may be used. This may be done using electroplating or other fill techniques.

Figure 6:
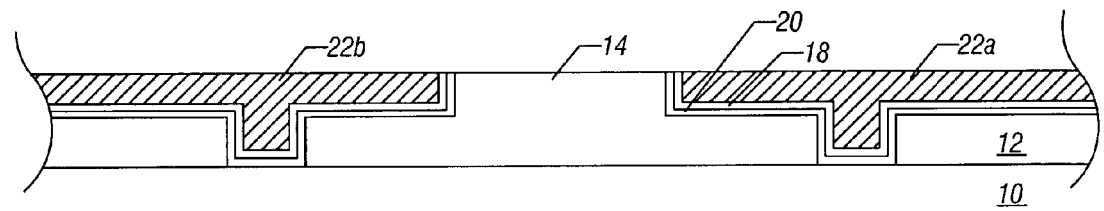
FIG. 6 is an enlarged cross-sectional view of the wafer after further processing in accordance with one embodiment of the present invention.

Copper 22 may be removed from the wafer field using chemical mechanical planarization or any other planarization technique to result in the planar surface shown in FIG. 6. Thus, a pair of copper metal lines 22a and 22b may be formed on either side of the dielectric separator 14. These steps may be repeated for any number of layers.

In some embodiments of the present invention, oxidation of the diffusion barrier is reduced by using a noble metal. This may be accomplished without the need to provide an in situ seed layer. The noble metal diffusion barrier is conductive enough to enable direct plating on the barrier without the need for a copper seed in some embodiments. The unoxidized noble metal diffusion barrier may promote adhesion between the plated copper and the underlying bulk barrier material without the use of an intermediate adhesion layer and may reduce the need to remove a native metal oxide layer from the barrier in the copper plating tool in some applications. The noble metal diffusion barrier thickness may be thin enough to enable removal of the barrier material from the field of the wafer using chemical mechanical planarization or a low-pressure chemical mechanical planarization.

By using a single barrier material process, tool throughput may be increased and integration concerns may be reduced in some embodiments. In addition, the need to first etch a barrier material, prior to copper plating, to improve adhesion, may be reduced in some embodiments. Also, the need to chemically activate the barrier surface may be reduced in some embodiments, thereby saving process steps, lowering process cost, and alleviating reclamation and/or environmental concerns.

The deposition of noble metals using physical vapor deposition, chemical vapor deposition, and atomic layer deposition is well known. For example the deposition of ruthenium is described in Y. Matsui et al., Electro. And Solid-State Letters, 5, C18 (2002) using Ru(EtCp)2. The use of [RuC5H5(CO)2]2,3 to deposit ruthenium is described in K. C. Smith et al., Thin Solid Films, v376, p. 73 (November 2000). The use of Ru-tetramethylhentane dionate and Ru(CO)6 to deposit ruthenium is described in http://thin-film.snu.ac.kr/research/electrode.htm. The deposition of rhodium is described in A. Etspuler and H. Suhr, Appl. Phys. A, vA48, p. 373 (1989) using dicarbonyl (2,4-pentanedionato)rhodium(I).

The deposition of molybdenum is described in K. A. Gesheva and V. Abrosimova, Bulg. J. of Phys., v19, p. 78 (1992) using Mo(Co)6. The deposition of molybdenum using MoF6 is described in D. W. Woodruff and R. A. Sanchez-Martinez, Proc. of the 1986 Workshop of the Mater. Res. Soc., p. 207 (1987). The deposition of osmium is described in Y. Senzaki et al., Proc. of the 14$^{th}$ Inter. Conf. And EUROCVD-11, p. 933 (1997) using Os(hexafluoro-2-butyne)(CO)4. The deposition of palladium is described in V. Bhaskaran, Chem. Vap. Dep., v3, p. 85 (1997) using 1,1,1,5,5,5-hexafluoro-2,4-pentanedionato palladium(II) and in E. Feurer and H. Suhr, Tin Solid Films, v157, p. 81 (1988) using allylcyclopentadienyl palladium complex.

The deposition of platinum is described in M. J. Rand, J. Electro. Soc., v122, p. 811 (1975) and J. M. Morabito and M. J. Rand, Thin Solid Films, v22, p.293 (1974) using Pt(PF3)4) and in the Journal of the Korean Physical Society, Vol. 33, November 1998, pp. S148-S151 using ((MeCp)PtMe$_3$) and in Z. Xue, H. Thridandam, H. D. Kaesz, and R. F. Hicks, Chem. Mater. 1992, 4, 162 using ((MeCp)PtMe$_3$).

The deposition of gold is described in H. Uchida et al., Gas Phase and Surf. Chem. of Electro. Mater. Proc. Symp., p. 293 (1994) and H. Sugawara et al., Nucl. Instrum. and Methods in Physics Res., Section A, v228, p. 549 (1985) using dimethyl(1,1,1,5,5,5-hexafluoroaminopenten-2-onato)Au(III). The deposition of iridium has been described using (Cyclooctadiene)Iridium(hexafluoroacetylacetonate). Noble metals may be plated directly on tantalum nitride using two-step plating processes involving a basic electroplating bath copper seed plating followed by acidic electroplating bath copper bulk plating.

Figure 7:
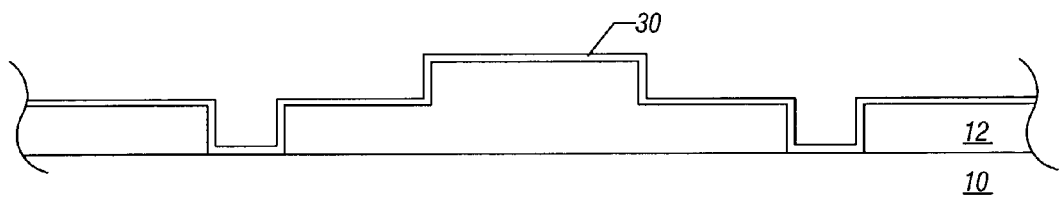
FIG. 7 is an enlarged cross-sectional view of a wafer in accordance with another embodiment of the present invention.

Referring to FIG. 7, in accordance with another embodiment of the present invention, the structure shown in FIG. 1 may be covered with an oxidizeable copper diffusion barrier 30 using physical vapor deposition, chemical vapor deposition, atomic layer deposition, or other methods. Suitable oxidizeable barrier materials include Ta(N), tungsten, TiN, TiNSi, cobalt, and nickel.

Using the chemical vapor deposition or atomic layer deposition approach, a thin nitride or oxide barrier layer can be grown to promote adhesion to the surrounding dielectric material by varying the input reactant gases in some embodiments. The bulk barrier composition can then be grown and, if desired, its composition can be varied throughout the barrier thickness by varying the individual precursor flow rates, pulse times (for atomic layer deposition), and input partial pressures relative to the carrier gas. Chemical vapor deposition and/or atomic layer deposition methods may lead to greater step coverage, symmetry, and within-wafer uniformity compared to a physical vapor deposition approach in some cases.

Figure 8:
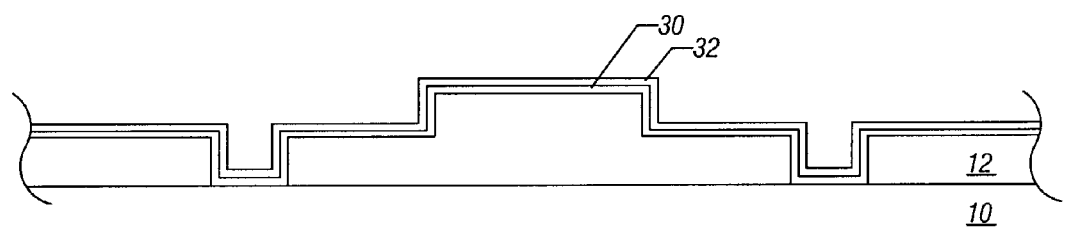
FIG. 8 is an enlarged cross-sectional view of the wafer shown in FIG. 7 after further processing in accordance with one embodiment of the present invention.

Referring next to FIG. 8, a thin noble metal cap 32 may then be deposited using chemical vapor deposition or atomic layer deposition, as two examples, to improve the step coverage and to provide a continuous capping film at a thin thickness to enable subsequent chemical mechanical planarization of the barrier/cap in the wafer field.

Figure 9:
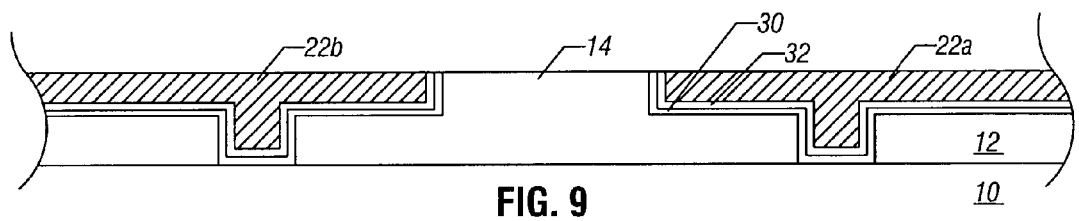
FIG. 9 is an enlarged cross-sectional view of the wafer of FIG. 8 after further processing in accordance with one embodiment of the present invention.

Subsequently, a copper layer 22 may be deposited and planarized to achieve the result shown in FIG. 9. Copper metal lines 22a and 22b are formed on either side of the dielectric separator 14. The steps shown above may be repeated for any number of interconnect layers.

In some embodiments, a thin noble metal capping film may be deposited, without vacuum break, onto a copper diffusion barrier. The thin metal capping film may not form a native oxide layer upon exposure to the ambient. The metal capping film thickness may be thin enough to enable chemical mechanical polishing of the copper with complete barrier removal from the wafer field. The sandwiched copper diffusion barrier stack may be conductive enough to enable direct plating on the barrier without the need for a copper seed. The unoxidized noble metal cap may promote adhesion between the plated copper and the underlying bulk barrier material and may reduce the need to remove a native metal oxide layer from the barrier in the copper plating tool.

Figure 10:
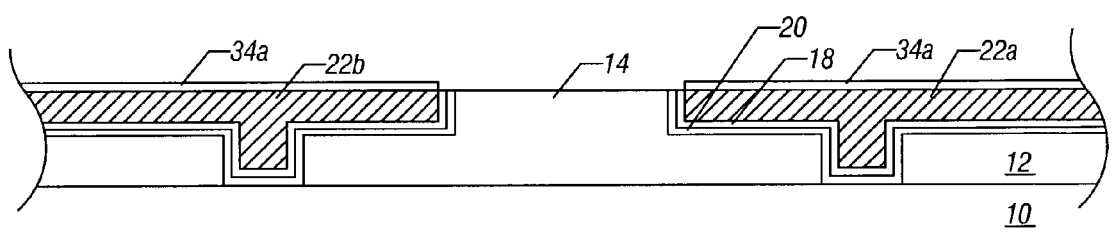
FIG. 10 is an enlarged cross-sectional view in accordance with another embodiment of the present invention after further processing of the wafer shown in FIG. 6 in accordance with one embodiment of the present invention.
Figure 11:
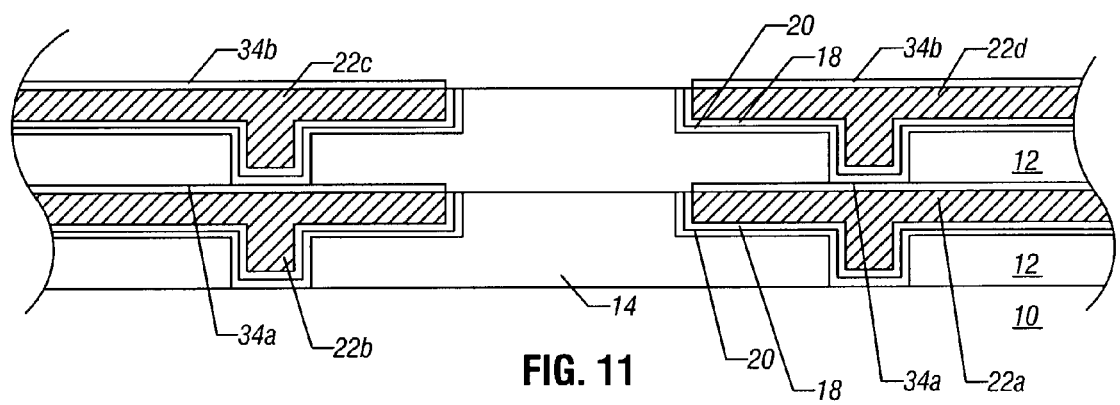
FIG. 11 is an enlarged cross-sectional view of the embodiment shown in FIG. 10 after further processing in accordance with one embodiment of the present invention.

Referring to FIGS. 10 and 11, the copper lines, such as the copper lines 22a and 22b, may be further protected by noble metal. In one embodiment, ruthenium electroless bath compositions may be used to cap copper lines with noble metals.

Ruthenium electroless bath compositions may contain ruthenium water soluble compounds, such as ruthenium chloride, ruthenium nitrosyl hydrate, and the like, complexing agents, such as ethylene diamine tetraacetic acid, ethylene diamine, triethanol amine, tartaric acid, and the like, reducing agents to reduce ruthenium, such as borohydrate, dimethyl amine borane complex, hydrazine hydrate, and the like, and a pH adjuster such as potassium or sodium hydroxide, tetramethyl ammonium hydroxide, and the like.

A noble metal capping layer 34a may be formed on top of the damascene copper lines 22a and 22b, as shown in FIG. 10. The copper surfaces may be pretreated to activate the copper with contact displacement of noble metals and/or pretreatment in a reducing agent solution which is catalytic on the copper surface and catalytic to reduce noble metals. Examples of suitable reducing agent solutions include dimethyl amine borane (DMAB) or borohydrate for ruthenium, rhodium, platinum, palladium, gold, and silver. The pretreatment may be followed by electroless plating of the noble metals selectively on top of the damascene copper lines 22.

Referring to FIG. 11, subsequent lines, such as lines 22c and 22d, may be formed on top of lines 22a and 22b and, particularly, on top of the layer 34a. Subsequently, a capping layer 34b may be formed by the same technique on top of the copper lines 22c and 22d. The layer 34b may also serve as an electroless (EL) shunt in some embodiments.

In accordance with one embodiment of the present invention, a ruthenium plating solution may include ruthenium (III) at 1 to 10 grams per liter, ethylene diamine tetraacetic acid at 20 to 100 grams per liter, potassium hydroxide at 100 to 200 grams per liter, DMAB at 1 to 10 grams per liter, at 15 to 60° C. and a pH of about 10 to about 13.

Initially, the copper surface of the copper lines 22a and 22b may be pretreated to activate the copper lines with contact displacement deposition of noble metals and/or pretreatment in a reducing agent solution which is catalytic on the copper surface and catalytic to reduce the noble metals. This may be followed by electroless plating of the noble metals selectively on top of the damascene copper lines. In addition to ruthenium, rhodium, platinum, palladium, gold, or silver are additional examples of noble metals that may be deposited. The next dielectric layer 12 is formed and the dielectric layer may be planarized using chemical mechanical polishing. A photoresist layer may be formed and the vias or trenches may be patterned as before.

Wet or dry cleaning may be done after etching the inter-level dielectric 12 with HF or amine-based chemistry, to mention two examples. The steps may be repeated with each inter-lever dielectric. Optionally, an anneal may be done after EL shunt layer deposition to stabilize the EL shunt microstructure and to facilitate H2 removal from the layer.

While the present invention has been described with respect to a limited number of embodiments, those skilled in the art will appreciate numerous modifications and variations therefrom. It is intended that the appended, claims cover all such modifications and variations as fall within the true spirit and scope of this present invention.

What is claimed is:

1. A method comprising:
   forming a dielectric layer;
   forming a trench in said dielectric layer;
   lining said trench with a first diffusion barrier of a non-noble metal material that is oxidizable;
   lining said trench and covering said first diffusion barrier with a noble metal diffusion barrier over said first diffusion barrier;
   forming a copper metal line in said trench over said noble metal diffusion barrier;
   coating a noble metal on said copper metal line; and
   depositing said noble metal using chemical vapor deposition.

2. The method of claim 1 including forming said copper metal line over said noble metal diffusion barrier.

3. The method of claim 1 including forming said metal line using damascene process.

4. The method of claim 1 including using a ruthenium plating solution to form a noble metal cap over a copper line.

5. The method of claim 4 including forming a solution with a pH from about 10 to about 13.

6. A method comprising:
   forming a dielectric layer;
   forming a trench in said dielectric layer;
   lining said trench with a first diffusion barrier of a non-noble metal material that is oxidizable;
   lining said trench and covering said first diffusion barrier with a noble metal diffusion barrier over said first diffusion barrier;
   forming a copper metal line in said trench over said noble metal diffusion barrier;
   coating a noble metal on said copper metal line; and
   depositing said noble metal using atomic layer deposition.

7. The method of claim 6 including forming said copper metal line over said noble metal diffusion barrier.

8. The method of claim 6 including forming said metal line using damascene process.

9. The method of claim 6 including using a ruthenium plating solution to form a noble metal cap over a copper line.

10. The method of claim 9 including forming a solution with a pH from about 10 to about 13.

* * * * *